(12) United States Patent
Kim et al.

(10) Patent No.: US 10,510,579 B2
(45) Date of Patent: Dec. 17, 2019

(54) ADHESIVE RESIN COMPOSITION FOR SEMICONDUCTOR, ADHESIVE FILM FOR SEMICONDUCTOR, AND DICING DIE BONDING FILM

(71) Applicant: LG CHEM, LTD., Seoul (KR)

(72) Inventors: Hee Jung Kim, Daejeon (KR); Jung Hak Kim, Daejeon (KR); Kwang Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/764,763

(22) PCT Filed: Sep. 22, 2017

(86) PCT No.: PCT/KR2017/010494
§ 371 (c)(1),
(2) Date: Mar. 29, 2018

(87) PCT Pub. No.: WO2018/066851
PCT Pub. Date: Apr. 12, 2018

(65) Prior Publication Data
US 2019/0043748 A1 Feb. 7, 2019

(30) Foreign Application Priority Data
Oct. 5, 2016 (KR) .................. 10-2016-0128444

(51) Int. Cl.
| | | |
|---|---|---|
| *H01L 21/301* | (2006.01) | |
| *H01L 21/46* | (2006.01) | |
| *H01L 21/78* | (2006.01) | |
| *H01L 21/683* | (2006.01) | |
| *C09J 133/14* | (2006.01) | |
| *C09J 11/04* | (2006.01) | |
| *C09J 11/08* | (2006.01) | |

(52) U.S. Cl.
CPC ........... *H01L 21/6836* (2013.01); *C09J 11/04* (2013.01); *C09J 11/08* (2013.01); *C09J 133/14* (2013.01); *H01L 21/78* (2013.01); *H01L 2221/68327* (2013.01)

(58) Field of Classification Search
CPC ...... H01L 21/78; H01L 21/6836; C09J 11/04; C09J 11/08; C09J 133/14
USPC ........................................................ 438/464
See application file for complete search history.

(56) References Cited

U.S. PATENT DOCUMENTS

| | | |
|---|---|---|
| 7,517,724 B2 | 4/2009 | Hatakeyama et al. |
| 7,674,859 B2 | 3/2010 | Saiki et al. |
| 7,682,692 B2 * | 3/2010 | Amano .................. C09J 133/04 428/355 AC |
| 8,211,540 B2 | 7/2012 | Hong et al. |
| 8,557,896 B2 | 10/2013 | Jeong et al. |
| 9,482,896 B2 | 11/2016 | Kim et al. |
| 9,798,185 B2 | 10/2017 | Kim et al. |
| 2008/0242058 A1 | 10/2008 | Ichikawa et al. |
| 2009/0004829 A1 | 1/2009 | Saiki et al. |
| 2014/0298862 A1 * | 10/2014 | Yang ..................... B24B 37/20 65/61 |
| 2016/0336290 A1 | 11/2016 | Kim et al. |

FOREIGN PATENT DOCUMENTS

| | | |
|---|---|---|
| CN | 104449452 A | 3/2015 |
| JP | 4319108 | 8/2009 |
| JP | 2010-150300 A | 7/2010 |
| JP | 2010-254763 A | 11/2010 |
| JP | 5421288 B2 | 2/2014 |
| JP | 2005-303275 A | 10/2015 |
| KR | 10-2006-0033726 A | 4/2006 |
| KR | 10-2008-0088487 A | 10/2008 |
| KR | 10-2009-0004542 A | 1/2009 |
| KR | 10-0934558 B1 | 12/2009 |
| KR | 10-1023241 B1 | 3/2011 |
| KR | 10-1248008 B1 | 3/2013 |
| KR | 10-1355853 B1 | 1/2014 |
| KR | 10-1492629 B1 | 2/2015 |
| KR | 10-2016-0058711 A | 5/2016 |
| KR | 10-2016-0107210 A | 9/2016 |

OTHER PUBLICATIONS

Search Report and Written Opinion issued for International Application No. PCT/KR2017/010494 dated Jan. 11, 2018, 10 pages.

* cited by examiner

*Primary Examiner* — David S Blum
(74) *Attorney, Agent, or Firm* — Rothwell, Figg, Ernst & Manbeck, P.C.

(57) ABSTRACT

The present invention relates to an adhesive resin composition for a semiconductor, including: a (meth)acrylate-based resin including a (meth)acrylate-based repeating unit containing an epoxy-based functional group and a (meth)acrylate-based repeating unit containing an aromatic functional group, the (meth)acrylate-based resin having a hydroxyl equivalent weight of 0.15 eq/kg or less; a curing agent including a phenol resin having a softening point of 100° C. or higher; and an epoxy resin, wherein the content of a (meth)acrylate-based functional group containing an aromatic functional group in the (meth)acrylate-based resin is 2 to 40% by weight, an adhesive film for a semiconductor including the above adhesive resin composition for a semiconductor, a dicing die bonding film including an adhesive layer including the adhesive film for a semiconductor, and a method for dicing a semiconductor wafer using the dicing die bonding film.

16 Claims, No Drawings

ADHESIVE RESIN COMPOSITION FOR SEMICONDUCTOR, ADHESIVE FILM FOR SEMICONDUCTOR, AND DICING DIE BONDING FILM

CROSS-REFERENCE TO RELATED APPLICATION(S)

This application is a 35 U.S.C. 371 National Phase Entry application from PCT/KR2017/010494, filed Sep. 22, 2017, which claims priority to and the benefit of Korean Patent Application No. 10-2016-0128444 filed on Oct. 5, 2016, with the Korean Intellectual Property Office, which are incorporated herein by reference in their entirety.

TECHNICAL FIELD

The present invention relates to an adhesive resin composition for a semiconductor, an adhesive film for a semiconductor, and a dicing die bonding film. More specifically, the present invention relates to an adhesive resin composition for a semiconductor that can more easily burry unevenness such as that caused by wires of a semiconductor substrate, can improve the reliability of a semiconductor chip due to improved physical properties of a cured product, can realize improved mechanical properties together with high heat resistance and adhesive strength, and yet can be applied to various cutting methods without specific limitations to realize excellent an cutting property, thus improving reliability and efficiency of a semiconductor packaging process, and an adhesive film for a semiconductor and a dicing die bonding film produced from the above resin composition.

BACKGROUND ART

Recently, with an increasing tendency of electronic devices toward miniaturization, high functionalization, and capacity enlargement, a demand for high density and highly integrated semiconductor packages has been rapidly increasing, and thus the size of semiconductor chips increasingly becomes large, and in terms of the improvement in the degree of integration, a stack packaging method of stacking chips in multi-stages is being increasingly used.

Depending on the use of the multi-stage semiconductor stack package, the thickness of the chip becomes thinner and the degree of integration of the circuit becomes higher. However, the modulus of the chip itself is lowered, causing problems in the manufacturing process and the reliability of the final product.

In order to solve these problems, attempts have been made to strengthen the physical properties of the adhesive used in the semiconductor packaging process.

In addition, as a semiconductor chip has recently become thinner, there is a problem in that the chip is damaged in the existing blade cutting process thus lowering a yield, and in order to overcome this, a preparation process of firstly cutting a semiconductor chip with a blade and then polishing it has been suggested.

An adhesive is not cut in such preparation process. That is, the adhesive is cut using a laser and then cut through an expanding process of the base film at a low temperature.

Further, recently, in order to protect the circuit on the chip, a process of cutting the adhesive through the low temperature expansion process and the heat shrinking process is applied without using a laser.

However, conventional adhesives have low ductility and thus are not easily cut at room temperature, and also when allowed to stand at room temperature after being cut, re-adhesion occurs due to the low ductility, consequently lowering the production yield of semiconductor chips.

DETAILED DESCRIPTION OF THE INVENTION

Technical Problem

It is one object of the present invention to provide an adhesive resin composition for a semiconductor that can improve the reliability of a semiconductor chip due to improved physical properties of the cured product, and can be applied to various cutting methods without specific limitations to realize an excellent cutting property, thus improving reliability and efficiency of a semiconductor packaging process.

It is another object of the present invention to provide an adhesive film for a semiconductor that can improve the reliability of the semiconductor chip due to improved physical properties of the cured product, and can be applied to various cutting methods without specific limitations to realize an excellent cutting property, thus improving reliability and efficiency of a semiconductor packaging process.

It is a further object of the present invention to provide a dicing die bonding film including the above-mentioned adhesive film for the semiconductor.

Technical Solution

In the present invention, an adhesive resin composition for a semiconductor is provided, including: a (meth)acrylate-based resin including a (meth)acrylate-based repeating unit containing an epoxy-based functional group and a (meth)acrylate-based repeating unit containing an aromatic functional group, the (meth)acrylate-based resin having a hydroxyl equivalent weight of 0.15 eq/kg or less; a curing agent including a phenol resin having a softening point of 100° C. or higher; and an epoxy resin, wherein the content of (meth)acrylate-based functional group containing an aromatic functional group in the (meth)acrylate-based resin is 2 to 40% by weight.

The weight ratio of the (meth)acrylate-based resin relative to the total weight of the (meth)acrylate-based resin, the epoxy resin, and the phenol resin may be 0.55 to 0.95.

The (meth)acrylate-based resin may contain 3 to 30% by weight, or 5 to 25% by weight, of the (meth)acrylate-based functional group containing the aromatic functional group.

The aromatic functional group may be an aryl group having 6 to 20 carbon atoms, or an arylalkylene group containing an aryl group having 6 to 20 carbon atoms and an alkylene group having 1 to 10 carbon atoms.

The (meth)acrylate-based repeating unit containing an epoxy-based functional group may include a cycloalkylmethyl(meth)acrylate repeating unit having 3 to 20 epoxy carbon atoms.

The "cycloalkylmethyl having 3 to 20 epoxy carbon atoms" refers to a structure in which a cycloalkyl having 3 to 30 carbon atoms to which an epoxy group is bonded is substituted with a methyl group.

Examples of the cycloalkylmethyl(meth)acrylate having 3 to 20 epoxy carbon atoms include glycidyl(meth)acrylate or 3,4-epoxycyclohexylmethyl(meth)acrylate.

Meanwhile, the (meth)acrylate-based resin may further include at least one repeating unit selected from the group consisting of a vinyl-based repeating unit containing a reactive functional group and a (meth)acrylate-based functional group containing an alkyl group having 1 to 10 carbon atoms.

The reactive functional group may include at least one functional group selected from the group consisting of alcohols, amines, carboxylic acids, epoxides, imides, (meth)acrylates, nitriles, norbornenes, olefins, polyethylene glycols, thiols, and vinyl groups.

The phenol resin having a softening point of 100° C. or higher may have a softening point of 110° C. to 160° C.

The phenol resin may include at least one selected from the group consisting of a bisphenol A novolac resin and a biphenyl novolac resin.

The epoxy resin may include at least one selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane type of epoxy resin, an alkyl modified triphenolmethane type of epoxy resin, a naphthalene type of epoxy resin, a dicyclopentadiene type of epoxy resin, and a dicyclopentadiene modified phenol type of epoxy resin.

The softening point of the epoxy resin may be 50° C. to 120° C.

The epoxy equivalent weight of the epoxy resin may be 100 to 300 g/eq.

The (meth)acrylate-based resin may be a (meth)acrylate-based resin having a glass transition temperature of −10° C. to 20° C.

The curing agent may further include at least one compound selected from the group consisting of an amine-based curing agent and an acid anhydride-based curing agent.

The adhesive resin composition for a semiconductor may further include an ion scavenger including: a metal oxide including one or more metals selected from the group consisting of zirconium, antimony, bismuth, magnesium, and aluminum; porous silicate; porous aluminosilicate; or zeolite.

The adhesive resin composition for a semiconductor may further include at least one curing catalysts selected from the group consisting of a phosphorous compound, a boron compound, a phosphorous-boron compound, and an imidazole-based compound.

The adhesive resin composition for a semiconductor may further include at least one additive selected from the group consisting of a coupling agent and an inorganic filler.

The adhesive resin composition for a semiconductor may further include 10 to 90% by weight of an organic solvent.

In addition, in the present invention, an adhesive film for a semiconductor including the above-mentioned adhesive resin composition for a semiconductor is provided.

The adhesive film may have a thickness of 1 μm to 300 μm.

Further, the adhesive film may have a thickness of 1 μm or more, 3 m or more, 5 μm or more, or 10 μm or more.

The adhesive film may have a thickness of 300 ran or less, 100 μm or less, 90 μm or less, or 70 μm or less.

The adhesive film for a semiconductor may have a modulus of 100 MPa or more when being elongated by 5% at a speed of 0.3 mm/s at room temperature.

The adhesive film for a semiconductor may have a modulus of 55 MPa or more, generated when being elongated by 10% at a speed of 0.3 mm/s at room temperature, and may have a modulus of 40 MPa or more, generated at 15% elongation.

The adhesive film for a semiconductor may be a die bonding film.

Accordingly, the adhesive film for the semiconductor may further include the adhesive layer described above and a release film formed on one side of the adhesive layer.

The elongation of the adhesive film for the semiconductor at room temperature may be 300% or less.

In the present invention, a dicing die bonding film including a base film, a tacky layer formed on the base film, and an adhesive layer formed on the tacky layer and including the adhesive resin composition for a semiconductor is provided.

The base film has a thickness of 10 μm to 200 μm, the tacky layer has a thickness of 1 μm to 600 μm, 3 μm to 500 μm, or 5 μm to 300 μm, and the adhesive film has a thickness of 1 μm to 300 μm.

The adhesive film may have a thickness of 1 μm or more, 3 μm or more, 5 μm or more, or 10 μm or more.

The adhesive film may have a thickness of 300 μm or less, 100 μm or less, 90 μm less, or 70 μm or less.

In addition, in the present invention, a method for dicing a semiconductor wafer including the steps of: partially pre-treating a semiconductor wafer including the dicing die bonding film and a wafer laminated on at least one side of the dicing die bonding film so as to be completely cut or cuttable; and irradiating ultraviolet light to the base film of the pre-treated semiconductor wafer and picking up individual chips separated by the cutting of the semiconductor, is provided.

Advantageous Effects

According to the present invention, an adhesive resin film for a semiconductor that can more easily burry unevenness such as that caused by wires of a semiconductor substrate, can improve the reliability of a semiconductor chip due to improved physical properties of the cured product, can realize improved mechanical properties together with high heat resistance and adhesive strength, and yet can be applied to various cutting methods without specific limitations to realize excellent cutting property, thus improving reliability and efficiency of a semiconductor packaging process, may be provided.

The adhesive film for a semiconductor, due to its unique properties, can be applied for non-contact-type adhesive cutting, for example, DBG (Dicing Before Grinding), as well as wafer cutting using a knife blade, and has an excellent cutting property even at a relatively low temperature, and thus, even if it is allowed to stand at room temperature after being cut, possibility of re-adhesion becomes low, thus increasing reliability and efficiency in a semiconductor manufacturing process.

Further, the adhesive film for a semiconductor can be applied to various semiconductor package manufacturing processes, enables securing of high reliability in the adhesion process of a semiconductor chip and a support member such as a substrate or a chip of the lower layer, and can realize excellent workability while securing heat resistance, moisture resistance, and an insulation property required when a semiconductor tip is installed in a semiconductor package.

In addition, the adhesive film for a semiconductor may secure improved elasticity and high mechanical properties, thus preventing burr generation in a dicing die bonding film including the adhesive film and in a method for dicing a semiconductor wafer using the dicing die bonding film,

DETAILED DESCRIPTION OF THE EMBODIMENTS

The adhesive resin composition for a semiconductor, the adhesive film for a semiconductor, and the dicing die bonding film according to specific embodiments of the invention will be described in more detail below.

According to one embodiment of the invention, an adhesive resin composition for a semiconductor is provided, including: a (meth)acrylate-based resin including a (meth)acrylate-based repeating unit containing an epoxy-based functional group and a (meth)acrylate-based repeating unit containing an aromatic functional group, the (meth)acrylate-based resin having a hydroxyl equivalent weight of 0.15 eq/kg or less; a curing agent including a phenol resin having a softening point of 100° C. or higher; and an epoxy resin, wherein the content of a (meth)acrylate-based functional group containing an aromatic functional group in the (meth)acrylate-based resin is 2 to 40% by weight.

The present inventors conducted studies on components that can be used for bonding or packaging semiconductors, and found through experiments that the adhesive or the adhesive film manufactured using the adhesive resin composition for a semiconductor according to the above embodiment can improve reliability of a semiconductor chip due to improved physical properties of the cured product, and can be applied to various cutting methods without specific limitations to realize an excellent cutting property, thus improving reliability and efficiency of a semiconductor packaging process, thereby completing the present invention.

In addition, the present inventors found through experiments that the adhesive film manufactured from the adhesive resin composition for a semiconductor according to the above embodiment has high breaking strength and low elongation at break, and thus can be applied for non-contact-type adhesive cutting, for example, DBG (Dicing Before Grinding), as well as wafer cutting using a knife blade, and has an excellent cutting property even at a relatively low temperature, and thus, even if it is allowed to stand at room temperature after being cut, possibility of re-adhesion becomes low, thus increasing reliability and efficiency in a semiconductor manufacturing process.

As described above, the adhesive resin composition for a semiconductor may include a (meth)acrylate-based resin including a (meth)acrylate-based repeating unit containing an epoxy-based functional group and a (meth)acrylate-based repeating unit containing an aromatic functional group.

As the (meth)acrylate-based resin includes a (meth)acrylate-based repeating unit containing an aromatic functional group, the adhesive resin composition for a semiconductor and the adhesive film produced therefrom can secure higher compatibility and adhesive strength between the components contained therein, and have high elasticity. Further, it is possible to prevent a phenomenon in which the adhesive is softened due to heat generated when cutting the wafer, and a burr being generated in a part of the adhesive. Further, the adhesive resin composition for a semiconductor and the adhesive film produced therefrom exhibit relatively improved initial tensile modulus, thereby realizing a high cutting property even in an expanding process that is performed at a low temperature, further increasing pickup efficiency in a dicing process, and securing a high cutting property at low and high temperatures.

Moreover, as the (meth)acrylate-based resin includes a (meth)acrylate-based repeating unit containing an epoxy-based functional group, the adhesive resin composition for a semiconductor and the adhesive film produced therefrom have a more uniform and rigid internal structure, and thus high impact resistance can be ensured during multistage stacking of an ultrathin wafer, and further, electrical properties after manufacture of semiconductor may be improved.

In addition, the (meth)acrylate-based resin exhibits a hydroxyl equivalent weight of 0.15 g/eq or less, or 0.10 g/eq or less, and thus is more smoothly and uniformly cured with an epoxy without inhibiting compatibility with other components of the resin composition, for example, an epoxy resin or a phenol resin. In particular, it enables a more uniform and rigid internal structure during curing of the resin composition, and exhibits an improved initial tensile modulus, thereby realizing a high cutting property even in the expanding process that is performed at a low temperature.

When the hydroxyl equivalent weight of the (meth)acrylate resin is high, for example, when it is more than 0.15 eq/kg, the compatibility with the epoxy resin, the phenol resin, or the like is lowered, and the uniformity of the appearance properties and mechanical properties may be deteriorated. In particular, when the adhesive film is initially elongated at room temperature, it is difficult to obtain a high modulus, and it may be difficult to ensure a sufficient cutting property in the expanding process at a low temperature.

The content of the (meth)acrylate-based functional group containing an aromatic functional group in the (meth)acrylate-based resin may be 2 to 40% by weight, 3 to 30% by weight, or 5 to 25% by weight.

If the content of the (meth)acrylate-based functional group containing an aromatic functional group in the (meth)acrylate-based resin is too low, the effect of increasing the compatibility with the epoxy resin or the phenol resin may be insignificant, and the effect of lowering the hygroscopic property of the finally produced adhesive film is insignificant, thereby making it difficult to obtain the effect expected from the composition of the embodiment.

If the content of the (meth)acrylate-based functional group containing an aromatic functional group in the (meth)acrylate-based resin is too high, the adhesive strength of the finally produced adhesive film can be lowered.

The aromatic functional group may be an aryl group having 6 to 20 carbon atoms, or an arylalkylene group including an aryl group having 6 to 20 carbon atoms and an alkylene group having 1 to 10 carbon atoms.

The (meth)acrylate-based repeating unit containing an epoxy-based functional group may include a cycloalkylmethyl(meth)acrylate repeating unit having 3 to 20 epoxy carbon atoms.

The "cycloalkylmethyl having 3 to 20 epoxy carbon atoms" refers to a structure in which a cycloalkyl having 3 to 30 carbon atoms to which an epoxy group is bonded is substituted with a methyl group.

Examples of the cycloalkylmethyl(meth)acrylate repeating unit having 3 to 20 epoxy carbon atoms include glycidyl (meth)acrylate or 3,4-epoxycyclohexylmethyl(meth)acrylate.

Meanwhile, the (meth)acrylate-based resin may further include at least one repeating unit selected from the group consisting of a vinyl-based repeating unit containing a reactive functional group and a (meth)acrylate-based functional group containing an alkyl group having 1 to 10 carbon atoms.

The reactive functional group may include at least one functional group selected from the group consisting of alcohols, amines, carboxylic acids, epoxides, imides, (meth)acrylates, nitriles, norbornenes, olefins, polyethylene glycols, thiols, and vinyl groups.

When the (meth)acrylate-based resin further includes at least one repeating unit selected from the group consisting of a vinyl-based repeating unit containing a reactive functional group and a (meth)acrylate-based functional group containing an alkyl group having 1 to 10 carbon atoms, the (meth)acrylate-based resin may contain 0.1 to 20% by weight, or 0.5 to 10% by weight, of the (meth)acrylate-based repeating unit containing the epoxy-based functional group.

The (meth)acrylate-based resin may have a glass transition temperature of −10° C. to 20° C., or −5° C. to 15° C.

By using a (meth)acrylate-based resin having the above-described glass transition temperature, the adhesive resin composition for a semiconductor may have sufficient flowability and the finally produced adhesive film may secure high adhesive strength, and it is easy to prepare the adhesive film in the form of a thin film and the like using the adhesive resin composition for a semiconductor.

Meanwhile, in the adhesive resin composition for a semiconductor, the weight ratio of the (meth)acrylate-based resin relative to the total weight of the (meth)acrylate-based resin, the epoxy resin, and the phenol resin may be 0.55 to 0.95.

As the adhesive resin composition for a semiconductor includes the (meth)acrylate-based resin relative to the total weight of the (meth)acrylate-based resin, the epoxy resin, and the phenol resin within the above-described range, the adhesive film or the like produced from the adhesive resin composition for a semiconductor exhibits low elongation while exhibiting a relatively high modulus at the initial elongation, and thus can realize a high cutting property in the expanding process at a low temperature and at the same time realize high elasticity, excellent mechanical properties, and high adhesive strength.

If the weight ratio of the (meth)acrylate-based resin relative to the total weight of the (meth)acrylate-based resin, the epoxy resin, and the phenol resin is lower than the above-mentioned range, the adhesive properties of the adhesive film or the like produced from the adhesive resin composition for a semiconductor is lowered and thus the wettability of wafers is reduced, which makes it impossible to expect a uniform cutting property, and from the viewpoint of reliability, adhesion between the wafer and the adhesive film interface is lowered, which leads to a decrease in the adhesive strength and makes the reliability vulnerable.

If the weight ratio of the (meth)acrylate-based resin relative to the total weight of the (meth)acrylate-based resin, the epoxy resin, and the phenol resin is higher than the above-mentioned range, the modulus generated when the adhesive film or the like produced from the adhesive resin composition for a semiconductor being elongated by 5% to 15% at room temperature may not be sufficient and may become significantly high, and the elongation of the above-mentioned adhesive film at room temperature may be greatly increased and the cutting property becomes low, thereby greatly inhibiting workability.

The weight ratio of the epoxy resin and the phenol resin in the adhesive resin composition for a semiconductor can be adjusted in consideration of the properties of the finally produced product, and for example, the weight ratio may be 10:1 to 1:10.

Meanwhile, the curing agent included in the adhesive resin composition for a semiconductor may include a phenol resin having a softening point of 100° C. or more. The phenol resin may have a softening point of 100° C. or more, 110° C. to 160° C., or 115° C. to 150° C.

The adhesive resin composition for a semiconductor of the above embodiment may include a phenol resin having a relatively high softening point, and the phenol resin having a softening point of 100° C. or more, 110° C. to 160° C., or 115° C. to 150° C. as described above may form a base (or matrix) of the adhesive component together with the liquid epoxy resin and the thermoplastic resin having a glass transition temperature of −10° C. to 30° C., and allows the adhesive film produced from the adhesive resin composition for a semiconductor to have a higher tensile modulus and excellent adhesive strength at room temperature and have flow properties that are optimized for a semiconductor.

On the contrary, if the softening point of the phenol resin is less than the above-mentioned range, the tensile modulus of the adhesive film produced from the adhesive resin composition for a semiconductor at room temperature may be lowered or elongation at room temperature may be significantly increased, and the melt viscosity of the adhesive film may be decreased or the modulus may be lowered, and thus more burrs may be generated by heat generated in a dicing process or cutting property or pickup efficiency may be lowered.

Further, in the process of bonding the adhesive film or when the adhesive film is exposed to a high temperature condition for a long time, a large amount of bleed-out may be generated.

In addition, the phenol resin may have a hydroxyl equivalent weight of 80 g/eq to 400 g/eq, 90 g/eq to 250 g/eq, 100 g/eq to 178 g/eq, or 210 g/eq to 240 g/eq.

As the phenol resin has the above-mentioned hydroxyl equivalent weight range, the curing degree may be increased even with a short curing time, thus affording a higher tensile modulus and excellent adhesive strength at room temperature to the adhesive film produced from the adhesive resin composition for a semiconductor.

The phenol resin may include at least one selected from the group consisting of a bisphenol A novolac resin and a biphenyl novolac resin.

Meanwhile, the epoxy resin may serve to adjust the curing degree of the adhesive resin composition for a semiconductor, increase adhesive performance, or the like.

Specific examples of the epoxy resin include at least one polymer resin selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane type of epoxy resin, an alkyl modified triphenolmethane type of epoxy resin, a naphthalene type of epoxy resin, a dicyclopentadiene type of epoxy resin, and a dicyclopentadiene modified phenol type of epoxy resin.

The softening point of the epoxy resin may be 50° C. to 120° C.

If the softening point of the epoxy resin is too low, the adhesive strength of the adhesive resin composition for a semiconductor may increase and thus the pickup property of chips after dicing can be lowered. If the softening point of the epoxy resin is too high, flowability of the adhesive resin composition for a semiconductor may be lowered, and the adhesive strength of the adhesive film produced from the adhesive resin composition for a semiconductor may be lowered.

The epoxy resin may have an epoxy equivalent weight of 100 to 300 g/eq.

The curing agent may further include at least one compound selected from the group consisting of an amine-based curing agent and an acid anhydride-based curing agent.

The amount of the curing agent used may be appropriately selected in consideration of physical properties of the finally produced adhesive film, and the like, and for example, it may be used in an amount of 10 to 700 parts by weight, or 30 to 300 parts by weight, based on 100 parts by weight of the epoxy resin.

The adhesive resin composition for a semiconductor may further include a curing catalyst.

The curing catalyst serves to facilitate the action of the curing agent or the curing of the adhesive resin composition for a semiconductor, and any curing catalyst known to be used in the manufacture of adhesive films for a semiconductor and the like may be used without particular limitation.

For example, as the curing catalyst, one or more kinds selected from the group consisting of a phosphorus compound, a boron compound, a phosphorous-boron compound, and an imidazole-based compound may be used.

The amount of the curing catalyst used may be appropriately selected in consideration of physical properties of the finally produced adhesive film, and the like, and for example, it may be used in an amount of 0.5 to 10 parts by weight, based total 100 parts by weight of the liquid and solid epoxy resin, the (meth)acrylate-based resin, and the phenol resin.

The adhesive resin composition for a semiconductor may further include an ion scavenger including: a metal oxide including one or more metals selected from the group consisting of zirconium, antimony, bismuth, magnesium, and aluminum; porous silicate; porous aluminosilicate; or zeolite.

Examples of the metal oxide including one or more metals selected from the group consisting of zirconium, antimony, bismuth, magnesium, and aluminum may include a zirconium oxide, an antimony oxide, a bismuth oxide, a magnesium oxide, an aluminum oxide, an antimony bismuth-based oxide, a zirconium bismuth-based oxide, a zirconium magnesium-based oxide, a magnesium aluminum-based oxide, an antimony magnesium-based oxide, an antimony aluminum-based oxide, an antimony zirconium-based oxide, a zirconium aluminum-based oxide, a bismuth magnesium-based oxide, a bismuth aluminum-based oxide, or a mixture of two or more kinds thereof.

The ion scavenger may serve to adsorb metal ions or halogen ions and the like existing inside the adhesive resin composition for a semiconductor or the adhesive film produced therefrom, and thus may improve electrical reliability of the wires in contact with the adhesive film.

The content of the ion scavenger in the adhesive resin composition for a semiconductor is not particularly limited, but considering the reactivity with transition metal ions, workability, and the physical properties of the adhesive film manufactured from the resin composition, it may be included in an amount of 0.01 to 20% by weight, preferably 0.01 to 10% by weight, based on the total solid weight of the adhesive composition for a semiconductor.

The adhesive resin composition for a semiconductor may further include 10% by weight to 90% by weight of an organic solvent.

The content of the organic solvent may be determined in consideration of the physical properties of the adhesive resin composition for a semiconductor, the physical properties of the finally produced adhesive film, and the manufacturing processes.

Meanwhile, the adhesive resin composition for a semiconductor may further include one or more additives selected from the group consisting of a coupling agent and an inorganic filler.

Examples of the coupling agent and inorganic filler are not particularly limited, and components known to be usable in an adhesive for semiconductor packaging may be used without particular limitations.

Meanwhile, according to another embodiment of the present invention, an adhesive film for a semiconductor including the adhesive resin composition for a semiconductor can be provided.

The adhesive film may have a thickness of 1 μm to 300 μm.

Further, the adhesive film may have a thickness of 1 μm or more, 3 μm or more, 5 μm or more, or 10 μm or more.

In addition, the adhesive film may have a thickness of 300 μm or less, 100 μm or less, 90 μm or less, or 70 μm or less.

The adhesive film for a semiconductor may have a modulus of 100 MPa or more when being elongated by 5% at a speed of 0.3 mm/s at room temperature.

Further, the adhesive film for a semiconductor may have a modulus of 55 MPa or more, generated at 10% elongation at a speed of 0.3 mm/s at room temperature, and may have a modulus of 40 MPa or more, generated at 15% elongation.

The adhesive film for the semiconductor may be a die bonding film.

Accordingly, the adhesive film for the semiconductor may further include the above-described adhesive layer and a release film formed on one side of the adhesive layer.

The elongation of the adhesive film for the semiconductor at room temperature may be 300% or less.

The adhesive film for a semiconductor exhibits low elongation while exhibiting relatively high elasticity during initial elongation, and can realize a high cutting property in the expanding process at a low temperature and at the same time realize high elasticity, excellent mechanical properties, and high adhesive strength.

The adhesive film for a semiconductor is applied to a package having a multilayered structure of semiconductor chips to realize a more stable structure, mechanical properties such as excellent heat resistance and impact resistance, and also prevent reflow cracks and the like. In particular, even when exposed to a high temperature condition for a long time that is applied in a semiconductor manufacturing process, voids may not be substantially generated.

The adhesive film for the semiconductor has high breaking strength and low elongation at break, and thus can be applied for non-contact-type adhesive cutting, for example, DBG (Dicing Before Grinding), as well as wafer cutting using a knife blade, and has an excellent cutting property even at a low temperature, and thus, even if it is allowed to stand at room temperature after being cut, possibility of re-adhesion becomes low, thus increasing reliability and efficiency in a semiconductor manufacturing process.

The adhesive film may be used as a die attach film (DAF) for attaching a lead frame or a substrate with a die, or attaching a die with a die.

Thus, the adhesive film may be processed in the form of a die bonding film, a dicing die bonding film, or the like.

The die bonding film may further include an inorganic filler dispersed in the continuous phase base material.

More details of the adhesive resin composition for a semiconductor of the above embodiment include those described above.

According to another embodiment of the invention, a dicing die bonding film including a base film; a tacky layer formed on the base film; and an adhesive layer formed on the tacky layer and including the above-mentioned adhesive resin composition for a semiconductor, can be provided.

As the adhesive layer includes the adhesive resin composition for a semiconductor according to the above-mentioned embodiment, the dicing die bonding film may have excellent mechanical properties such as heat resistance and impact resistance and the like, and high adhesive strength, and can exhibit a low absorption rate, thus preventing vaporization of moisture, delamination between a wafer and a die bonding film, or a reflow crack due to the vaporization and the like.

The details of the adhesive resin composition for a semiconductor are the same as those described above.

The kind of the base film included in the dicing die bonding film is not particularly limited, and for example, plastic films or metal foils and the like known in this field may be used.

For example, the base film may include low density polyethylene, linear polyethylene, medium density polyethylene, high density polyethylene, ultra-low density polyethylene, a random copolymer of polypropylene, a block copolymer of polypropylene, a homopolypropylene, a polymethylpentene, an ethylene-vinyl acetate copolymer, an ethylene-methacrylic acid copolymer, an ethylene-methylmethacrylate copolymer, an ethylene-ionomer copolymer, an ethylene-vinyl alcohol copolymer, a polybutene, a copolymer of styrene, or a mixture of two or more kinds thereof.

The base film including a mixture of two or more kinds of polymers refer to including both a multi-layered film in which the films each containing the above-mentioned polymers are stacked in two or more layers, and a mono-layered film including two or more types of the above-mentioned polymers.

The thickness of the base film is not particularly limited, and it is commonly formed to have a thickness of 10 µm to 200 µm, preferably 50 µm to 180 µm.

If the thickness is less than 10 µm, there is a concern that the control of cut depth may be unstable in a dicing process, and if it is greater than 200 µm, a large amount of burrs may be generated in a dicing process, or the elongation ratio may decrease, and thus an expanding process may not be precisely achieved.

The base film may be subjected to conventional physical or chemical treatments such as a matte treatment, a corona discharge treatment, a primer treatment, a crosslinking treatment, and the like, as necessary.

Meanwhile, the tacky layer may include a UV curable adhesive or a heat curable adhesive.

In case where the UV curable adhesive is used, UV is irradiated from the base film side to increase cohesive force and glass transition temperature of the adhesive, thus lowering adhesive strength, and in a case where the heat curable adhesive is used, the temperature is increased to lower the adhesive strength.

Moreover, the UV curable adhesive may include a (meth)acrylate-based resin, a UV curable compound, a photoinitiator, and a crosslinking agent.

The (meth)acrylate-based resin may have a weight average molecular weight of 100,000 to 1,500,000, preferably 200,000 to 1,000,000.

If the weight average molecular weight is less than 100,000, the coating property or cohesive force may be lowered, and thus a residue may remain on the adherent at the time of peeling, or a breakage phenomenon of the adhesive may occur.

Further, if the weight average molecular weight is greater than 1,500,000, the base resin may interfere with the reaction of the UV curable compound, and thus there is a concern that a decrease in peel strength may not be efficiently achieved.

Examples of the (meth)acrylate-based resin may include a copolymer of (meth)acrylic acid ester-based monomers and crosslinkable functional group-containing monomers.

Herein, examples of the (meth)acrylic acid ester-based monomers may include alkyl (meth)acrylate, more specifically, monomers having an alkyl group having 1 to 12 carbon atoms, such as pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate, decyl (meth)acrylate, or a mixture of two or more thereof.

As monomers containing an alkyl having a large number of carbon atoms are used, the glass transition temperature of the final copolymer becomes lower, and thus appropriate monomers may be selected according to the desired glass transition temperature.

Examples of the crosslinkable functional group-containing monomers may include hydroxyl group-containing monomers, carboxyl group-containing monomers, nitrogen-containing monomers, or mixtures of two or more thereof.

Herein, examples of the hydroxyl group-containing compounds may include 2-hydroxyethyl (meth)acrylate, 2-hydroxypropyl (meth)acrylate, and the like, examples of the carboxyl group-containing compounds may include (meth)acrylic acid and the like, and examples of the nitrogen-containing monomers may include (meth)acrylonitrile, N-vinyl pyrrolidone, N-vinyl caprolactam, and the like, but are not limited thereto.

In the (meth)acrylate-based resin, carbon-carbon double bond-containing low molecular weight compounds such as vinyl acetate, styrene, acrylonitrile, and the like may be additionally included in terms of the improvement of other functionalities such as compatibility.

The kind of the UV curable compounds is not particularly limited, and for example, multifunctional compounds having a weight average molecular weight of about 500 to 300,000 (e.g. multifunctional urethane acrylate, multifunctional acrylate monomers or oligomers, and the like) may be used.

One of ordinary knowledge in the art could easily select appropriate compounds according to the desired use.

The content of the UV curable compound may be 5 to 400 parts by weight, preferably 10 to 200 parts by weight, based on 100 parts by weight of the above-mentioned base resin. If the content of the UV curable compound is less than 5 parts by weight, a decrease in the adhesion strength after curing may not be sufficient, and thus there is a concern of lowering the pickup property, and if it is greater than 400 parts by weight, cohesive force of the adhesive before UV irradiation may be insufficient, or peeling of a release film and the like may not be easily performed.

The kind of the photoinitiator is also not particularly limited, and those commonly known in the art may be used. The content of the photoinitiator may be 0.05 parts by weight to 20 parts by weight, based on 100 parts by weight of the UV curable compound.

If the content of the photoinitiator is less than 0.05 parts by weight, a curing reaction by UV irradiation may become insufficient, which may reduce the pickup property, and if it is greater than 20 parts by weight, a crosslinking reaction may occur with a short unit in the curing process, unreacted UV curable compounds may be generated, which may cause residue on the surface of the adherent, or the peel strength after curing may excessively decrease which may lower the pickup property.

Further, the kind of the crosslinking agent that is included in the tacky part to afford adhesive strength and cohesive force is also not particularly limited, and conventional compounds such as isocyanate-based compounds, aziridine-based compounds, epoxy-based compounds, metal chelate-based compounds, and the like may be used.

The crosslinking agent may be included in an amount of 2 parts by weight to 40 parts by weight, preferably 2 parts by weight to 20 parts by weight, based on 100 parts by weight of the base resin.

If the content of the crosslinking agent is less than 2 parts by weight, cohesive force of the adhesive may be insufficient, and if the content is greater than 20 parts by weight, adhesion strength before UV irradiation may be insufficient, and thus there is a concern of chip scattering and the like.

Further, in the tacky layer, tackifiers such as a rosin resin, a terpene resin, a phenol resin, a styrene resin, an aliphatic petroleum resin, an aromatic petroleum resin, or an aliphatic aromatic copolymer petroleum resin may be further included.

A method for forming a tacky layer including the above components on a base film is not particularly limited, and for example, a method of directly coating an adhesive composition of the present invention onto a base film to form a tacky layer, or a method of firstly coating the adhesive composition onto a peelable base to prepare a tacky layer, and then transcribing the tacky layer to a base film using a peelable base, and the like may be used.

Herein, the methods of coating and drying the adhesive composition are not particularly limited, and for example, a method of coating the composition including the above components as it is, or diluting it in an appropriate organic solvent and coating by known means such as a comma coater, a gravure coater, a die coater, a reverse coater, and the like, and then drying the solvent at a temperature of 60° C. to 200° C. for 10 s to 30 min, may be used.

Further, in the above process, an aging process may be additionally carried out for progressing sufficient crosslinking reaction of the adhesive.

The thickness of the tacky layer is not particularly limited, but for example, it may be in the range of 1 μm to 600 μm, 3 μm to 500 μm, or 5 μm to 300 μm.

As described above, the adhesive layer is formed on the tacky layer, and may include the adhesive film for a semiconductor of the above embodiment.

The details of the adhesive film for a semiconductor include those described above.

The thickness of the adhesive layer is not particularly limited, but for example, it may have a thickness of 1 μm to 300 μm.

Further, the adhesive film may have a thickness of 1 μm or more, 3 μm or more, 5 μm or more, or 10 μm or more.

In addition, the adhesive film may have a thickness of 300 μm or less, 100 μm or less, 90 μm or less, or 70 μm or less.

The dicing die bonding film may further include a release film formed on the adhesive layer.

Examples of the release film that can be used may include one or more kinds of plastic films such as a polyethylene terephthalate film, a polytetrafluoroethylene film, a polyethylene film, a polypropylene film, a polybutene film, a polybutadiene film, a vinylchloride copolymer film, a polyimide film, and the like.

The surface of the release film may be treated with one or more of alkyd-based, silicon-based, fluorine-based, unsaturated ester-based, polyolefin-based, or wax-based release agents, among which heat resistant alkyd-based, silicon-based, or fluorine-based release agents are particularly preferred.

The release film may be commonly formed to have a thickness of 10 μm to 500 μm, preferably about 20 μm to 200 μm, but is not limited thereto.

A method for manufacturing the above-described dicing die bonding film is not particularly limited, and for example, a method of sequentially forming a tacky part, an adhesive part, and a release film on a base film, or a method of separately preparing a dicing film (a base film+a tacky part) and a release film on which a die bonding film or an adhesive part is formed, and then laminating them, and the like, may be used.

The lamination method is not particularly limited, and hot roll lamination or a laminate press may be used, among which hot roll lamination is preferred in terms of the possibility of a continuous process, and process efficiency.

The hot roll lamination may be carried out at a temperature of 10° C. to 100° C. under a pressure of 0.1 kgf/cm$^2$ to 10 kgf/cm$^2$, but is not limited thereto.

According to yet another embodiment of the invention, a method for dicing a semiconductor wafer is provided, including the steps of: partially pre-treating a semiconductor wafer including the dicing die bonding film; laminating a wafer on at least one side of the dicing die bonding film so as to be completely cut or cuttable; and irradiating ultraviolet light to the base film of the pre-treated semiconductor wafer and picking up individual chips separated by the cutting of the semiconductor.

The details of the dicing die bonding film include those described above.

Except for the particulars regarding the steps of the dicing method, commonly known apparatuses and methods used for the dicing method of a semiconductor wafer and the like may be used without particular limitations.

The method for dicing a semiconductor wafer may further include a step of expanding the semiconductor wafer after the pretreatment.

In this case, processes of irradiating ultraviolet light to the base film of the expanded semiconductor wafer and picking up individual chips separated by cutting of the semiconductor wafer are followed.

By using the dicing die bonding film including the dicing film, burrs that may be generated during a dicing process of a semiconductor wafer may be minimized, thus preventing contamination of a semiconductor chip and improving reliability and lifetime of a semiconductor chip.

Specific embodiments of the invention will be described in more detail by way of the following examples. However, these examples are only to illustrate specific embodiments of the invention, and the scope of the invention is not limited thereto.

Synthesis Example: Synthesis of Thermoplastic Resin 70 g of butyl acrylate, 15 g of acrylonitrile, 5 g of glycidyl methacrylate, and 10 g of benzyl methacrylate were mixed with 100 g of toluene, and the mixture was reacted at 80° C. for about 12 hours to obtain an acrylate resin 1 having a glycidyl group introduced into a branched chain (weight average molecular weight: about 900,000, glass transition temperature: 10° C.).

Then, the acrylate resin 1 was dissolved in dichloromethane, cooled, and then titrated with a 0.1N KOH methanol solution, and it was confirmed that the hydroxyl group equivalent weight was about 0.03 eq/kg.

Examples 1 to 5 and Comparative Examples 1 to 3: Preparation of Adhesive Resin Composition for Semiconductor and Adhesive Film for Semiconductor Example 1

(1) Preparation of a Solution of an Adhesive Resin Composition for a Semiconductor 57 g of phenol resin KH-6021 (produced by DIC Corp., bisphenol A novolac resin, hydroxyl equivalent weight: 121 g/eq, softening point: 125° C.), which is a curing agent for epoxy resin, 85 g of epoxy resin EOCN-104S (produced by Nippon Kayaku Co., Ltd., cresol novolac type of epoxy resin, epoxy equivalent weight: 214 g/eq, softening point: 83° C.), 425 g of the acrylate resin 1 of the synthesis example, 61.7 g of R972, 0.96 g of DICY, and 0.11 g of 2MAOK were mixed in a methyl ethyl ketone solvent to obtain a solution of an adhesive composition for a semiconductor (solid content: 20 wt % concentration).

(2) Preparation of Die Bonding Film

The above-prepared solution of an adhesive composition for a semiconductor was coated on a release-treated polyethylene terephthalate film (thickness 38 μm), and then dried at 110° C. for 3 min to obtain an adhesive film for a semiconductor (die bonding film) with a thickness of about 60 μm.

Examples 2 to 5

Solutions of adhesive resin compositions for a semiconductor (solid content: 20 wt % concentration) and adhesive films for a semiconductor (die bonding films) having a thickness of 60 μm were obtained in the same manner as in Example 1, except for applying the components and the amounts described in Table 1 below.

Comparative Examples 1 to 3

Adhesive films for a semiconductor (die bonding films) were obtained in the same manner as in Example 1, except that solutions of adhesive resin compositions for a semiconductor (methyl ethyl ketone: 20 wt % concentration) were prepared using the components and the amounts described in Table 1 below.

<Filler>

R 972: Evonik Industries, fumed silica, average particle size 17 nm

RY 200: Evonik Industries, fumed silica, average particle size 50 nm

<Acrylate Resin>

KG-3082: Acrylic resin synthesized at a composition ratio of butyl acrylate:acrylonitrile:glycidyl methacrylate:benzyl methacrylate=46:20:6:28 (weight average molecular weight: about 660,000, glass transition temperature: 14° C., hydroxyl equivalent weight: about 0.05 eq/kg)

KG-3077: Acrylic resin synthesized at a composition ratio of butyl acrylate:ethyl acrylate:acrylonitrile:glycidyl methacrylate:2-hydroxyethyl acrylate=45:20:20:4:11 (weight average molecular weight: about 750,000, glass transition temperature: 7.5° C., hydroxyl equivalent weight: about 0.65 eq/kg)

<Additive>

DICY: Dicyandiamide

2 MAK: Imidazole-based hardening accelerator

Experimental Examples: Evaluation of Physical Properties of Adhesive Films for Semiconductor Experimental Example 1: Evaluation of Room Temperature Tensile Properties (Measurement of Modulus and Elongation)

In order to measure the tensile properties of the adhesive films respectively obtained in the examples and comparative examples, a texture analyzer (Stable Micro System, Ltd.) was used.

Specifically, the adhesive films respectively obtained in the examples and comparative examples were cut into a size of width 15 mm and length 100 mm to prepare samples, and both ends were taped while leaving 50 mm of the central part of the samples.

Further, both ends of the taped samples were fixed to the apparatus, and while being elongated at a speed of 0.3 mm/s, a tensile curve was drawn.

TABLE 1

Composition of resin compositions of examples and comparative examples [unit: g]

| | | Example 1 | Example 2 | Example 3 | Example 4 | Example 5 | Comparative Example 1 | Comparative Example 2 | Comparative Example 3 |
|---|---|---|---|---|---|---|---|---|---|
| Curing agent | KH-6021 | 57 | 50 | 42 | 60 | 67 | | | |
| | KA-1160 | | | | | | 67 | 67 | |
| | KPH-65 | | | | | | | | 75 |
| Epoxy resin | MF-8080EK80 | | | 58 | 90 | | | 78 | |
| | EOCN-104S | 85 | 76 | | | | 100 | | |
| | NC-3000-H | | | | | 120 | | | 90 |
| Filler | R972 | 61.7 | 35 | 68 | 20 | 45 | 68 | 73 | 63 |
| | RY200 | | 35 | | 55 | 25 | | | |
| Acrylate resin | Acrylate resin 1 | 425 | | 435 | 442 | | | 480 | 450 |
| | KG-3082 | | 457 | | | 417 | | | |
| | KG-3077 | | | | | | 450 | | |
| Curing catalyst | DICY | 0.96 | 0.96 | 1.1 | 1.1 | 0.96 | 0.9 | 1.2 | 1.1 |
| | 2MAOK | 0.11 | 0.11 | 0.13 | 0.13 | 0.11 | 0.5 | 0.3 | 0.3 |

KH-6021: Bisphenol A novolac resin (DIC Corp., softening point: 125° C., hydroxyl equivalent: 118 g/eq)
KA-1160: Cresol novolac resin (DIC Corp., softening point: about 90° C., hydroxyl equivalent weight: 110 g/eq)
KPH-65: Xylock novolac resin (DIC Corp., softening point: about 90° C., hydroxyl equivalent weight: 175 g/eq)
MF-8080EK80: Bisphenol A epoxy resin (epoxy equivalent weight: 218 g/eq, softening point 60° C.)
EOCN-104S: Cresol novolac epoxy (epoxy resin equivalent, 180 g/eq, softening point: 90° C.)
NC-3000-H: Biphenyl novolac epoxy resin (epoxy equivalent weight: 180 g/eq, softening point 65° C.)

From the tensile curve, a gradient value at 5%, 10%, and 15% elongation was measured to determine a modulus, and a time when the sample was completely cut was measured to determine elongation.

Experimental Example 2: Observation of Burr Generation (1) Manufacture of Dicing Film 75 g of 2-ethylhexyl acrylate, 10 g of 2-ethylhexyl methacrylate, and 15 g of 2-hydroxyethyl acrylate were copolymerized in 300 g of an ethyl acrylate solvent to obtain a copolymer having a weight average molecular weight of 850,000 (glass transition temperature: 10° C.), and then 10 g of an acrylisocyanate compound as a photocurable material was added thereto, thus obtaining a reactant. Then, 10 g of a multifunctional isocyanate oligomer and 1 g of Darocur TPO as a photoinitiator were mixed to prepare a UV curable adhesive composition.

The UV curable adhesive composition was coated on a release-treated polyester film having a thickness of 38 μm so that the thickness after drying became 10 μm, and dried at 110° C. for 3 min. The dried tacky layer was laminated on a polyolefin film having a thickness of 100 μm to manufacture a dicing film.

(2) Manufacture of Dicing Die Bonding Film

The tacky layer obtained in the above process and each adhesive film obtained in the examples and comparative examples (width: 18 mm, length: 10 cm) were laminated to manufacture a multi-layered adhesive film for a dicing die bonding film.

(3) Measurement of Burr Generation Rate

Each dicing die bonding film prepared as above was laminated at 50° C. using a 100 μm wafer and a wafer ring mounter, and diced to a 10 mm*10 mm chip size at a speed of 40K rpm and 20 mm/s, using a dicing apparatus, and then the number of burrs generated on the die was confirmed to measure the burr generation rate.

Experimental Example 3: Evaluation of Low Temperature Cutting Property

The adhesives obtained in the examples and comparative examples were laminated to dicing films, thus manufacturing dicing die bonding films.

Using an 8 inch wafer with a 50 μm thickness that was pre-cut to a size of 5 mm*5 mm and a wafer ring mounter, each dicing die bonding film prepared as above was laminated at 60° C., and then allowed to stand at room temperature for 30 min.

Then, the wafer to which the dicing die bonding film was laminated was installed in a low temperature chamber, and low temperature expansion was conducted to a height of 5 mm at a speed of 100 mm/s at −10° C.

Further, the wafer was transferred to a thermal shrinking device, and expanded by 4 mm at 1 mm/s, and then heated to thermally shrink the dicing film.

Thereafter, the cutting ratio of the adhesive film at a low temperature was confirmed.

TABLE 3

Results of Experimental Example 3
Adhesive cutting ratio (%)

| Cold speed | Cold height | Example 1 | Example 2 | Example 3 | Example 4 | Example 5 | Comparative Example 1 | Comparative Example 2 | Comparative Example 3 |
|---|---|---|---|---|---|---|---|---|---|
| 50 mm/s | 6 mm | 100 | 100 | 100 | 100 | 100 | 97 | 96 | 72 |
|  | 8 mm | 100 | 100 | 100 | 100 | 100 | 99 | 98 | 93 |

As shown in Table 3, it was confirmed that the adhesive films manufactured in Examples 1 to 5 have a modulus generated at 5% elongation at room temperature of 100 MPa or more, a modulus generated at 10% elongation at room temperature of 55 MPa or more, and a modulus generated at 15% elongation at room temperature of 40 MPa or more.

It was also confirmed that the adhesive films manufactured in Examples 1 to 5 have physical properties in which the elongation at room temperature is 100% or less.

That is, the adhesive films manufactured in Examples 1 to 5 have properties in which they exhibit high modulus at the time of initial elongation, and with higher elongation, the modulus is relatively lowered, and have a low elongation at room temperature, thereby realizing a high cutting property in the expanding process at a low temperature.

More specifically, as shown in Table 3, it was confirmed that in the case of the adhesive films produced in Examples

TABLE 2

Results of Experimental Examples 1 and 2

|  | Example 1 | Example 2 | Example 3 | Example 4 | Example 5 | Comparative Example 1 | Comparative Example 2 | Comparative Example 3 |
|---|---|---|---|---|---|---|---|---|
| Modulus at 5% elongation at room temperature [unit: MPa] | 115 | 105 | 123 | 136 | 155 | 97 | 93 | 79 |
| Modulus at 10% elongation at room temperature [unit: MPa] | 63 | 58 | 88 | 95 | 83 | 58 | 55 | 46 |
| Modulus at 15% elongation at room temperature [unit: MPa] | 45 | 41 | 51 | 42 | 57 | 41 | 39 | 34 |
| Room temperature elongation [unit: %] | 250 | 276 | 267 | 285 | 274 | 259 | 266 | 279 |

1 to 5, low temperature expansion was conducted to a height of 6 mm or 8 mm at a speed of 50 mm/s at a temperature of −10° C. to −5° C., and as a result, it was possible to secure the cutting property of 100%.

On the contrary, it was confirmed that, in the dicing die bonding film manufactured using the adhesive films of Comparative Examples 1 and 3, there was no large difference between the moduli displayed at the time of continuing elongation, relative to a modulus displayed during initial elongation, and that low temperature expansion was conducted to a height of 6 mm or 8 mm at a speed of 50 mm/s at a temperature of −10° C. to −5° C., and as a result, it becomes possible to have a relatively low cutting property.

The invention claimed is:

1. An adhesive resin composition for a semiconductor, comprising: a (meth)acrylate-based resin including a (meth)acrylate-based repeating unit containing an epoxy-based functional group and a (meth)acrylate-based repeating unit containing an aromatic functional group, the (meth)acrylate-based resin having a hydroxyl equivalent weight of 0.15 eq/kg or less;
    a curing agent including a phenol resin having a softening point of 100° C. or higher; and
    an epoxy resin,
    wherein the content of a (meth)acrylate-based functional group containing an aromatic functional group in the (meth)acrylate-based resin is 2 to 40% by weight
    wherein the (meth)acrylate-based repeating unit containing an epoxy-based functional group includes a cycloalkylmethyl(meth)acrylate repeating unit having 3 to 20 epoxy carbon atoms.

2. The adhesive resin composition for a semiconductor of claim 1, wherein a weight ratio of the (meth)acrylate-based resin relative to the total weight of the (meth)acrylate-based resin, the epoxy resin, and the phenol resin is 0.55 to 0.95.

3. The adhesive resin composition for a semiconductor of claim 1, wherein the (meth)acrylate-based resin contains 3 to 30% by weight of the (meth)acrylate-based functional group containing the aromatic functional group.

4. The adhesive resin composition for a semiconductor of claim 1, wherein the aromatic functional group is an aryl group having 6 to 20 carbon atoms, or an arylalkylene group including an aryl group having 6 to 20 carbon atoms and an alkylene group having 1 to 10 carbon atoms.

5. The adhesive resin composition for a semiconductor of claim 1, wherein the (meth)acrylate-based resin further includes at least one repeating unit selected from the group consisting of a vinyl-based repeating unit containing a reactive functional group and a (meth)acrylate functional group containing an alkyl group having 1 to 10 carbon atoms.

6. The adhesive resin composition for a semiconductor of claim 1, wherein the phenol resin having a softening point of 100° C. or higher has a softening point of 110° C. to 160° C.

7. The adhesive resin composition for a semiconductor of claim 1, wherein the phenol resin includes at least one selected from the group consisting of a bisphenol A novolac resin and a biphenyl novolac resin.

8. The adhesive resin composition for a semiconductor of claim 1, wherein the epoxy resin includes at least one selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane type of epoxy resin, an alkyl modified triphenolmethane type of epoxy resin, a naphthalene type of epoxy resin, a dicyclopentadiene type of epoxy resin, and a dicyclopentadiene modified phenol type of epoxy resin.

9. The adhesive resin composition for a semiconductor of claim 1, wherein the softening point of the epoxy resin is 50° C. to 120° C.

10. The adhesive resin composition for a semiconductor of claim 1, wherein an epoxy equivalent weight of the epoxy resin is 100 to 300 g/eq.

11. The adhesive resin composition for a semiconductor of claim 1, wherein the (meth)acrylate-based resin is a (meth)acrylate-based resin having a glass transition temperature of −10° C. to 20° C.

12. An adhesive film for a semiconductor comprising a cured product of the adhesive resin composition for a semiconductor of claim 1.

13. The adhesive film for a semiconductor of claim 12, wherein the adhesive film has a thickness of 1 μm to 300 μm.

14. The adhesive film for a semiconductor of claim 12, wherein the adhesive film for a semiconductor has a modulus of 100 MPa or more when being elongated by 5% at a speed of 0.3 mm/s at room temperature.

15. A dicing die bonding film comprising a base film; a tacky layer formed on the base film; and an adhesive layer formed on the tacky layer and including a cured product of the adhesive resin composition for a semiconductor of claim 1.

16. The dicing die bonding film of claim 15, wherein the base film has a thickness of 10 μm to 200 μm,
    the tacky layer has a thickness of 1 μm to 600 μm,
    and the adhesive film has a thickness of 1 μm to 300 μm.

* * * * *